US008257500B2

(12) United States Patent
Struempfel et al.

(10) Patent No.: US 8,257,500 B2
(45) Date of Patent: Sep. 4, 2012

(54) TRANSPORT APPARATUS FOR ELONGATE SUBSTRATES

(75) Inventors: Johannes Struempfel, Dresden (DE); Reinhardt Bauer, Dresden (DE); Andreas Heisig, Dresden (DE); Andre Ulbricht, Dresden (DE); Steffen Goerke, Dresden (DE); Heiko Richter, Pesterwitz (DE); Falk Schwerdtfeger, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 875 days.

(21) Appl. No.: 12/247,250

(22) Filed: Oct. 8, 2008

(65) Prior Publication Data

US 2009/0095215 A1   Apr. 16, 2009

(30) Foreign Application Priority Data

Oct. 11, 2007   (DE) .......................... 10 2007 049 026

(51) Int. Cl.
*C23C 16/00* (2006.01)
*C23C 16/50* (2006.01)
*C23F 1/00* (2006.01)
*H01L 21/306* (2006.01)

(52) U.S. Cl. ........ 118/730; 118/715; 118/728; 118/729; 156/345.51; 156/345.54; 156/345.55

(58) Field of Classification Search .................. 118/715, 118/718, 719, 728–732; 156/345.51–345.55; 427/158, 283, 286, 331
See application file for complete search history.

(56) References Cited

U.S. PATENT DOCUMENTS

| 4,606,891 | A | * | 8/1986 | Murphy et al. .................. 422/53 |
| 4,851,095 | A | * | 7/1989 | Scobey et al. ............ 204/192.12 |
| 5,225,057 | A | * | 7/1993 | LeFebvre et al. ........ 204/192.13 |
| 6,110,285 | A | * | 8/2000 | Kitazawa et al. ............. 118/715 |
| 6,568,412 | B2 | * | 5/2003 | Egashira ....................... 134/159 |
| 2008/0083370 | A1 | | 4/2008 | Struempfel et al. |
| 2009/0011573 | A1 | * | 1/2009 | Marohl et al. ................ 438/478 |
| 2009/0114159 | A1 | | 5/2009 | Pollack et al. |

FOREIGN PATENT DOCUMENTS

| DE | 10 2007 048 758 | 4/2008 |
| DE | 10 2007 052 524 | 5/2009 |

* cited by examiner

*Primary Examiner* — Maureen Gramaglia
*Assistant Examiner* — Tiffany Nuckols
(74) *Attorney, Agent, or Firm* — Heslin Rothenberg Farley & Mesiti P.C.

(57) ABSTRACT

In a transport device for elongated substrates, especially in hot processes, which includes an essentially rectangular frame, formed by longitudinal and transverse spars connected to each other, in which at least three transverse spars are provided between two longitudinal spars, at least one transverse spar is made from a material, whose heat expansion coefficient differs from the heat expansion coefficient of the material of the other transverse spars or/and at least one transverse spar is connected force-free to at least one transverse support or/and at least one transverse spar is formed from an open profile.

14 Claims, 5 Drawing Sheets

Figure 1:
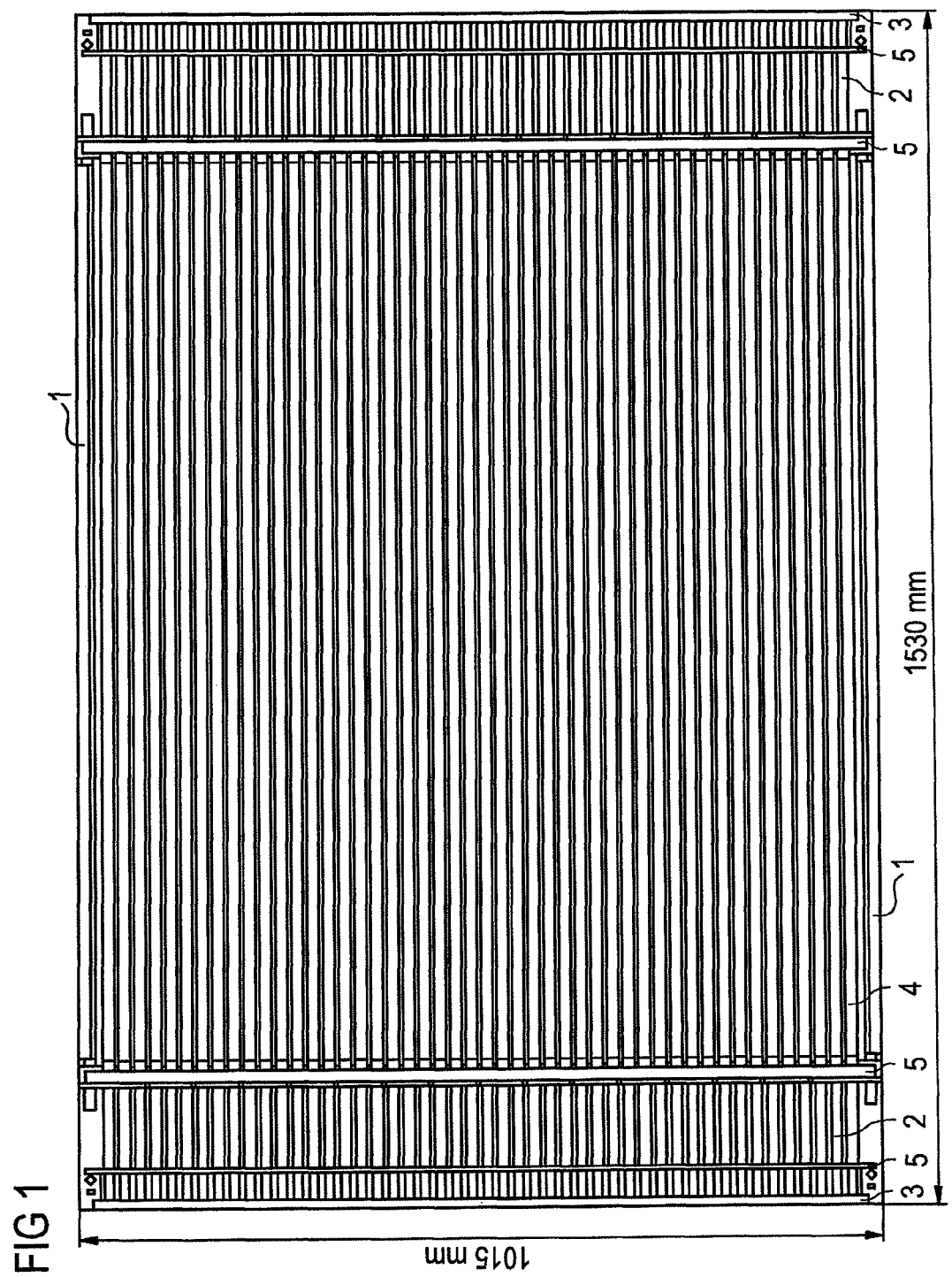

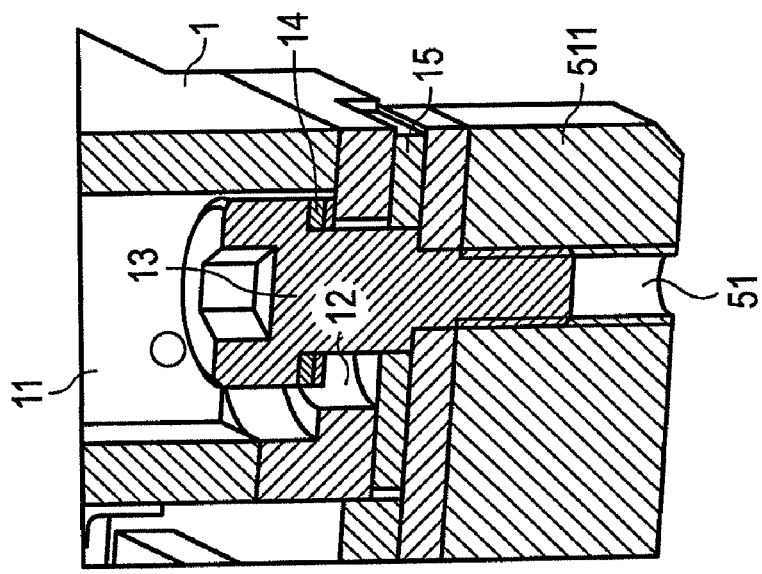
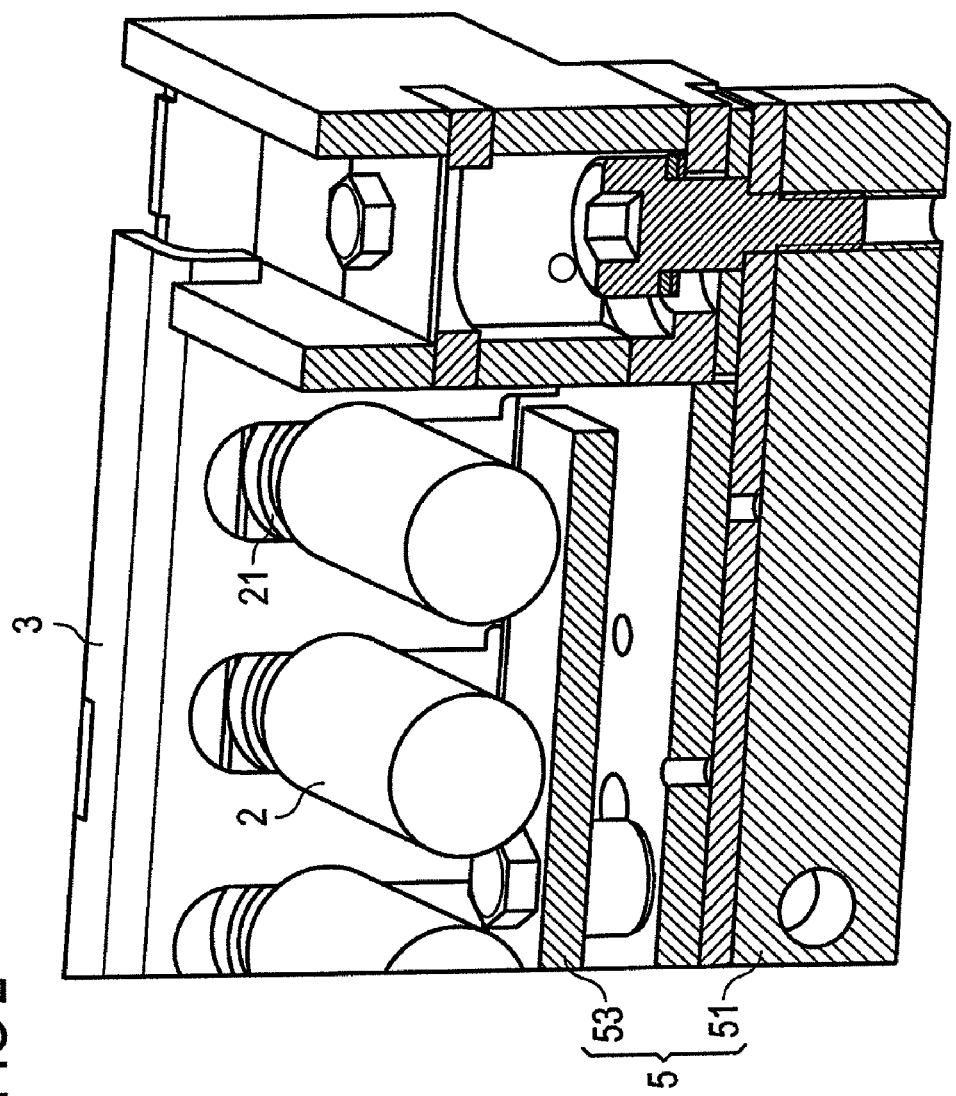
FIG 2

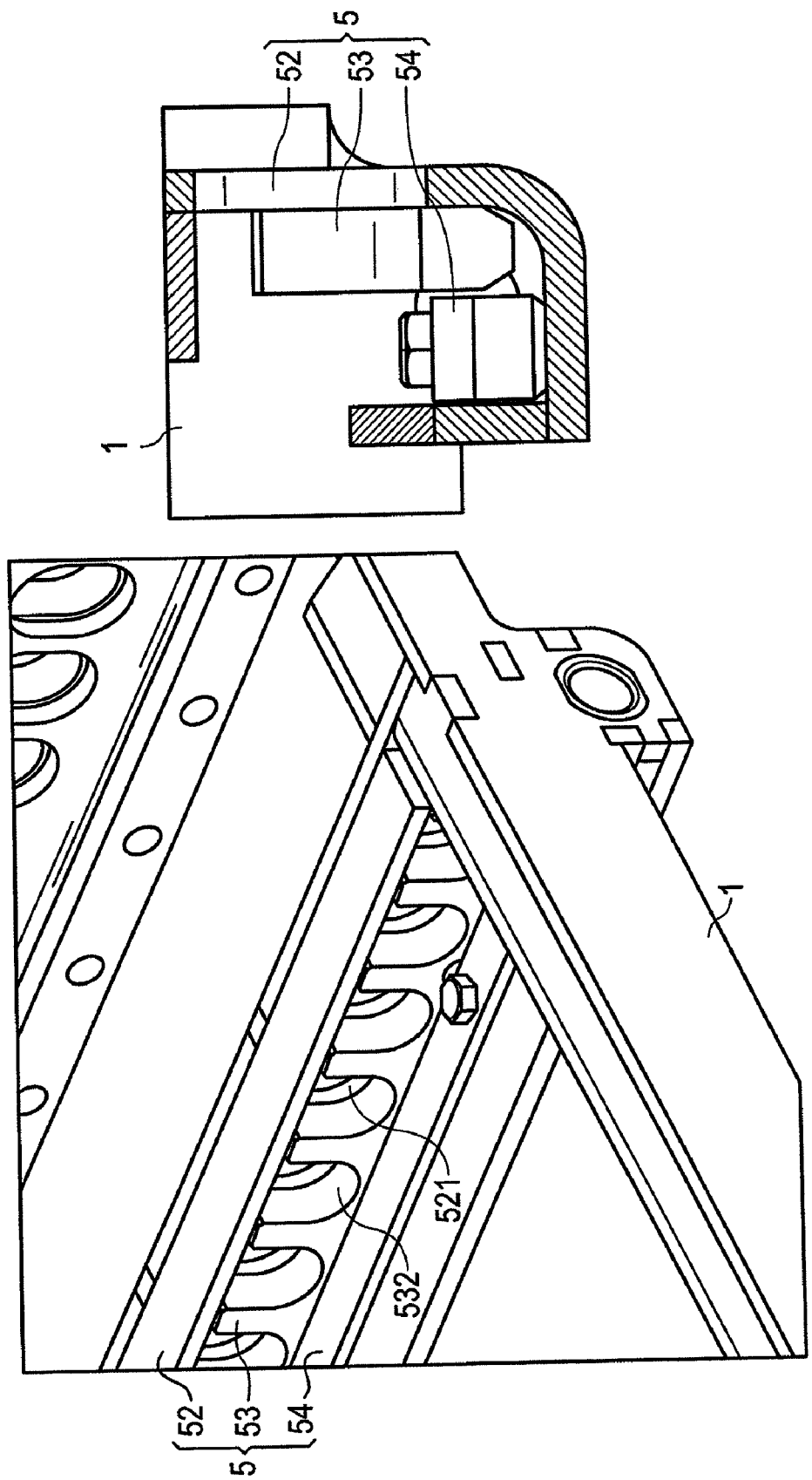

TRANSPORT APPARATUS FOR ELONGATE SUBSTRATES

CROSS REFERENCE TO RELATED APPLICATIONS

This application claims priority of German application No. 10 2007 049 026.9 filed on Oct. 11, 2007, the entire disclosure of this application is being hereby incorporated herein by reference.

BACKGROUND ART

The invention concerns a transport device for elongated substrates, suitable for transporting substrates within a vacuum processing system or through a vacuum processing system, especially for processes that run under high temperatures.

Transport devices that comprise an essentially rectangular frame are known for transport of substrates within a vacuum processing system or/and through the vacuum processing system. Such frame-like transport devices, as are described, for example, in Patent Application DE 10 2007 052 524, are used, in particular, to transport plate-like substrates through so-called continuous vacuum processing systems. For elongated substrates, a frame-like transport device is known from Patent Application DE 10 2007 048 758. On the other hand, transport devices comprising an essentially cylindrical frame, on which the substrates can be fastened, are also used in so-called batch vacuum processing systems. This transport device, often also referred to as a rotary basket, is mounted to rotate within the vacuum processing system, in order to move all substrates by the coating source or sources.

It has been found that the known transport devices can only be used with restriction for various applications. The known transport devices ordinarily produced from steel rods rigidly connected to each other can only be used with considerable restrictions or not at all in processes that occur under very high temperatures, for example, in the range from 400 to 800° C. In addition, a transport device is required, in which the substrates, for example, glass tubes, can be mounted rotatable. Here again, there is a requirement for certain processes that the support must withstand very high temperatures, get by without lubrication and be maintenance-free with very long lifetime.

BRIEF SUMMARY OF INVENTION

The task of the invention therefore consists of proposing improved transport devices to solve the problems described above.

To support the substrate the frame structure usually has holding elements (for example, so-called inserts). The holding elements can be mounted to rotate. Because of this, it is possible to rotate the substrates, for example, elongated substrates, like glass tubes or the like, around their own axis for uniform coating on all sides during transport past a coating source. The holding elements can be positioned in two groups on opposite sides of the frame structure to rotate, so that two oppositely arranged holding elements are connectable to the two ends of a substrate. The substrates are arranged between two holding elements in the frame, and are also mounted to rotate through the rotatable support of the two holding elements on opposite sides of the frame. In this way, tubular substrates can be positioned rotatably in the frame structure simply and free of maintenance.

It can further be prescribed that the holding elements of at least one of the two groups be designed to be driven by a drive device provided for this purpose. For example, the outward-facing ends of the holding elements can be designed as friction wheels, gears, etc., which can be driven by a drive device belonging to the vacuum processing system, in order to rotate the substrates around their own axis. To drive a holding element designed as a friction wheel on the outer end, the drive device can include an endless conveyor with a tension device guided around at least two deflection pulleys, for example, a stainless steel cable, which is actively connected during operation of the system to the end of the holding elements by friction. In particular, but not only in rectangular frame structures transported in the vertical position through the vacuum processing system, it can be sufficient to prescribe that one of the two groups of holding elements be drivable.

The frame structure can be formed, for example, from longitudinal and transverse spars connected to each other, in which the terms "longitudinal" and "transverse" refer to the direction of movement of the substrates within the vacuum processing system. Accordingly, a longitudinal spar is a frame element aligned parallel to the transport direction, whereas a transverse spar is arranged perpendicular to it. In a rectangular frame structure, the longitudinal and transverse spars can therefore be essentially straight rods. The wording "essentially straight" is then understood to mean that the longitudinal and transverse spars can have design-related bulges or other contour deviations. If the transport device is designed to accommodate elongated substrates, like glass tubes, these are advantageously arranged parallel to the transverse spars, so that the substrates, during transport within the vacuum processing system or through the vacuum processing system, can be rotated around their own axis, in which the drive device for transport of the substrates can simultaneously be used for their rotation. In a cylindrical transport device, the longitudinal spars can be essentially circular and the transverse spars also extend between these longitudinal spars. The wording "essentially circular" is then to be understood to be similar to the above explanation. Elongated substrates can be mounted fixed or rotatable on such a rotary basket, parallel to the transverse spars, i.e., the movement path of the substrate corresponds to the shape of the longitudinal spars, in which they can additionally be rotated around their own axis during rotation of the rotary basket, when the holding elements are mounted to rotate.

The holding elements can be designed, for example, as rotationally symmetric components, one end of which is designed conical, in order to be able to engage in the end of a tubular substrate (so-called inserts). The material for the inserts can be technical ceramic. Holding elements made of ceramic withstand high temperatures and can be mounted in the simplest manner in the frame structure, require no lubrication and no maintenance and are characterized by long lifetime.

The holding elements can be positioned in openings or holes of the longitudinal spars of the frame provided for this purpose. In a rotationally symmetric holding element of the type just described, it can be mounted in a middle area without additional support devices in one or more longitudinal spars, i.e., the middle area of the holding element and opening of the longitudinal spar or the longitudinal spars form the support for the holding element in the frame. If, for example, two parallel arranged longitudinal spars are provided on each side of the frame, each of which has an opening for each holding element, a particularly stable holding element is achieved, since tilting of the holding element is effectively prevented by simultaneous supporting in two longitudinal spars.

Especially in the case, in which the substrates are to be rotated around their own axis during the coating process, it is useful to arrange the transport device in the vacuum processing system, so that the longitudinal spars of the transport device are arranged parallel to the transport direction of the substrates.

It has been found that problems can develop in transport devices of the type just described owing to the fact that certain coating processes occur at very high temperatures.

In this case, the longitudinal supports of the frame can be exposed to different heat loads, so that the longitudinal supports of the frame expand with different intensity. The different length change of several longitudinal supports, however, means that the frame is deformed as soon as more than two longitudinal supports are present.

If the frame, for example, has two parallel longitudinal spars on each side and the transport device is arranged within the vacuum processing system, so that the longitudinal spars run parallel to the transport direction of the substrates, the two outermost longitudinal spars are situated closer to one of the chamber walls of the vacuum processing system (cooled in many cases) than the two other longitudinal spars. In any case, the two inner longitudinal spars are arranged much closer to the heat sources of the coating process (for example, heating devices, thermal evaporators, sputter sources and so forth) than the outer longitudinal spars, and are also more strongly heated than these spars on this account. In an example of a coating process, it was determined, for example, that at a process temperature of about 600° C., the inner longitudinal spars were heated to temperatures of about 400° C., whereas the outer longitudinal spars were only heated to about 100° C. Depending on the specific coating processes and the configuration of the vacuum processing system, even higher temperature differences are possible between the inner and outer longitudinal supports. It can easily be seen that such large temperature differences (in the present case, about 300 K) produce correspondingly large differences in longitudinal expansion of the outer and inner longitudinal supports, which, however, is hampered by the transverse supports fastened to the ends of the longitudinal supports. Because of this hampering of expansion, deformations of the entire frame are produced, which can lead to complete unusability of the frame.

A transport device for transport of elongated substrates through the vacuum processing system is proposed, which includes an essentially rectangular frame formed by transverse and longitudinal spars connected to each other, in which at least three longitudinal spars are provided between two transverse spars. For example, on at least one side of the frame, two longitudinal spars can be provided, which can also be arranged parallel to each other with a spacing. In one embodiment a total of four longitudinal spars can be provided, each of which is connected in pairs to one end of both transverse spars.

In order to permit different length expansions, without deformation of the frame, it is proposed that at least one longitudinal spar be made from the material, whose heat expansion coefficient differs from the heat expansion coefficient of the material of the other longitudinal spars. The material of the at least one longitudinal spar is then expediently chosen, so that during different heating of different longitudinal spars, because of the different heat expansion coefficients of the employed materials, the most uniform possible heat expansion of all longitudinal spars is produced.

This objective is better achieved, the more precisely the temperatures reached during operation of the transport device in the vacuum processing system, or at least temperature differences between the individual longitudinal spars can be estimated or determined. For example, for a longitudinal spar that is exposed to a relatively low temperature, a material can be chosen, whose heat expansion coefficient is greater than the heat expansion coefficient of another longitudinal spar exposed to a relatively high temperature. Another procedure consists of choosing a material for a longitudinal spar exposed to a relatively high temperature, whose heat expansion coefficient is smaller than the heat expansion coefficient of another longitudinal spar exposed to a relatively low temperature. In both cases, the difference between the length changes caused by the different heating of the longitudinal spars is less than in longitudinal spars produced from the same material and heated to different extents.

As an alternative approach or additional expedient, it is proposed that at least one longitudinal spar be connected force-free to at least one transverse spar. Force-free connection in this sense is supposed to be understood to mean a connection that establishes the position of the longitudinal spar along the transverse axis of the transverse spar, but permits a length change of the longitudinal spar, without a longitudinal force acting on the transverse spar. Such a force-free connection can be achieved by the fact that at least one end of a longitudinal spar is inserted into a recess of a transverse spar prescribed for this purpose. Another possibility consists of connecting at least one end of a longitudinal spar through a screw connection to a transverse spar, in which the screw is inserted into an elongated hole on at least one of the two joint partners, the transverse axis of which is oriented in the direction of heat expansion. The screw is then expediently fastened, so that it exerts no or only very limited clamping force on the two joint partners. It is understood that the screw can be replaced with the same effect by other fastening devices, for example, rivets. Other types of connections that suppress the development of a longitudinal force on the transverse spar, because of a length change of a longitudinal spar, are also considered to be included by the disclosed technical teachings.

Another alternative or additional approach is seen in the fact that at least one longitudinal spar is formed from an open profile. Open profile in this sense is to be understood to mean a profile, which, unlike a tube or rectangular hollow profile, for example, has no closed outer wall. Examples of open profiles are U-profiles (also called C-profiles) and modifications of such profiles. It has been found that longitudinal spars produced from open profiles have a particularly homogeneous temperature distribution over their longitudinal section, especially when the profile is arranged in the frame, so that it faces the open side of the strongest heat source. Because of this, the kinking tendency of a longitudinal spar, whose heat expansion is hampered, is reduced.

BRIEF DESCRIPTION OF THE DRAWING FIGURES

Figure 3:
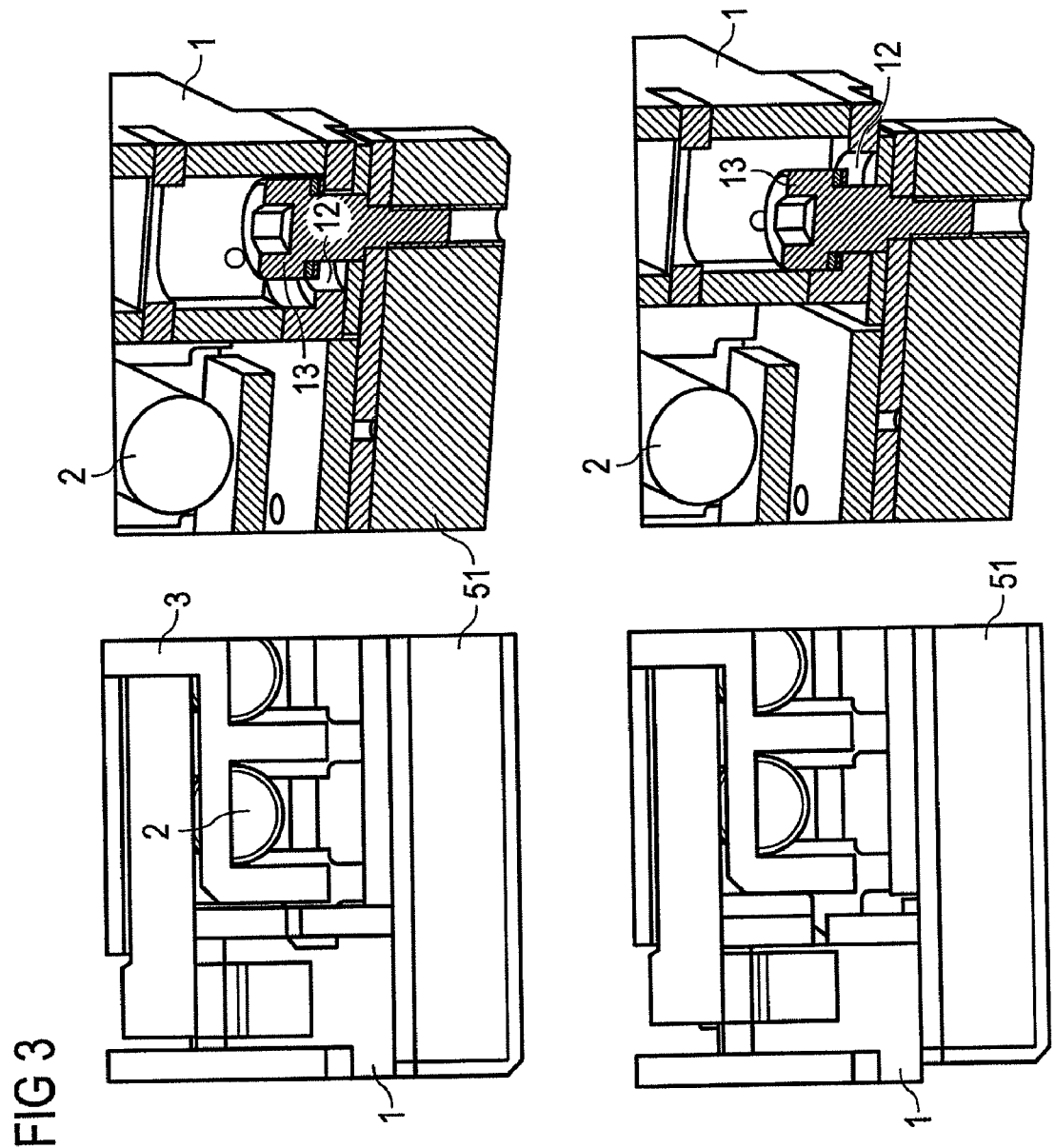
Figure 4:
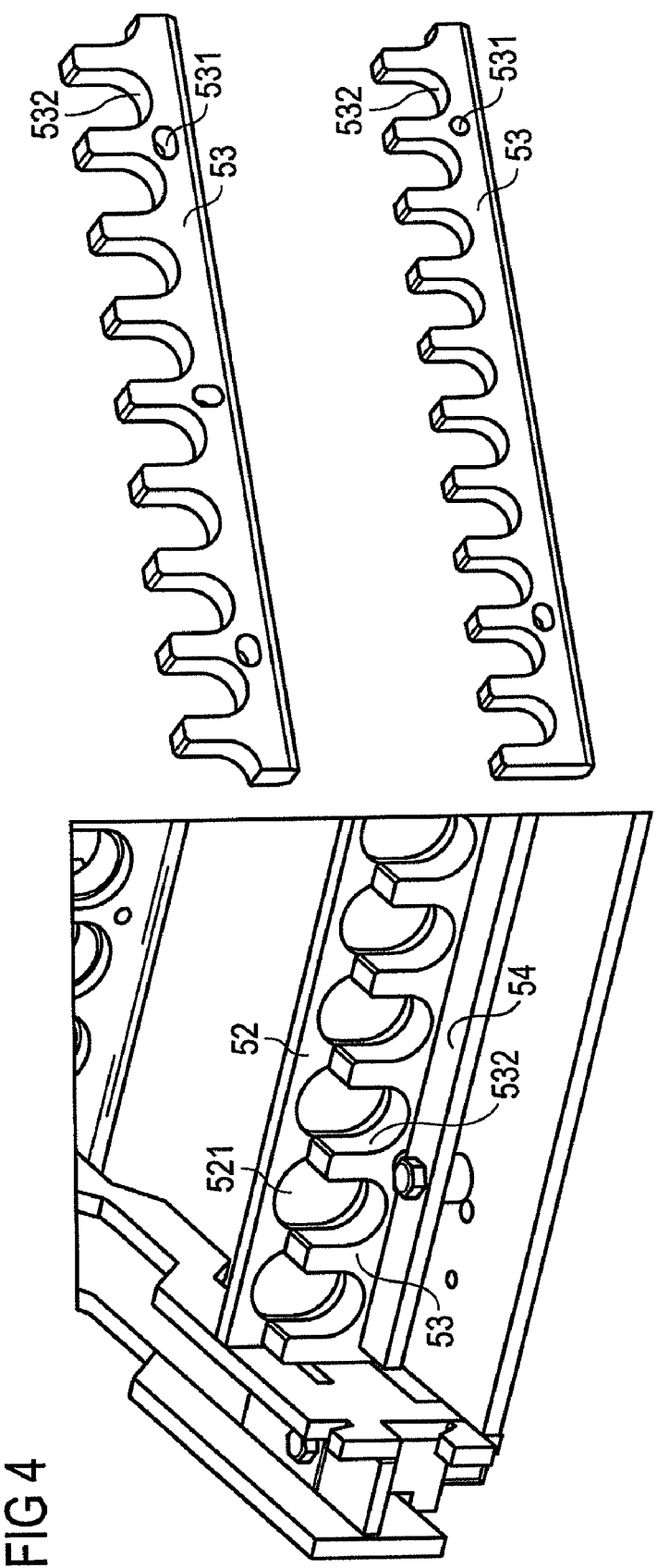

A variant of the described transport device is further explained below as an example by means of drawings. In the drawings FIG. 1 shows an overall view of the transport device, FIG. 2 shows a force-free connection between a longitudinal spar and a transverse spar in two sectional views, FIG. 3 shows the force-free connection from FIG. 2 at different temperatures in two different views, FIG. 4 shows an embodiment of an outer longitudinal spar,
FIG. 5 shows an embodiment of an inner longitudinal spar.

DETAILED DESCRIPTION

FIG. 1 shows an overall view of a embodiment of a transport device, which includes a frame formed from two transverse spars 1 and four longitudinal spars 5 connected to the transverse spars 1, in which the outer longitudinal spars 5 are each connected to one end of both transverse spars 1 and an inner longitudinal spar 5 is arranged parallel and at a spacing to the corresponding outer longitudinal spar 5. Each pair formed from an outer longitudinal spar 5 and an inner longitudinal spar 5 simultaneously serves to support a group of holding elements 2, so that two groups of holding elements 2 are mounted in the frame opposite each other and individually rotatable. The holding elements 2 each extend from the outer longitudinal spar 5 to the inner longitudinal spar 5 and protrude beyond it. The ends of the holding elements 2 protruding beyond the inner longitudinal spar 5 are designed conical and serve to accommodate one end of a tubular substrate 4, so that the substrates 4 extend parallel to the transverse spars 1 in the area enclosed by the transverse spars 1 and the inner longitudinal spars 5.

A section through an outer longitudinal spar 5 and a transverse spar 1 connected force-free to this longitudinal spar 5 is shown in FIG. 2. The outer longitudinal spar 5 includes a support cog 53 to support the holding elements 2, as well as a drive rail 51, which serves for movement of the transport device through a vacuum processing system. The force-free connection of the outer longitudinal spar 5 with the transverse spar 1 is achieved by a screw connection. For this purpose, the transverse spar 1 has an opening 11, into which a screw 13 is inserted. On the bottom of opening 11, an elongated hole 12 is provided, whose transverse axis runs parallel to the transverse axis of the outer longitudinal spar 5 and extends through the shaft to screw 13, so that the screw 13 can be screwed into a threaded hole 511 of drive rail 51 provided for this purpose. The shaft of screw 13 has a shoulder, which limits the screw-in depth of screw 13 into threaded hole 511 and, in so doing, prevents the outer longitudinal spar 5 and transverse spar 1 from being pressed against each other by a clamping force. In order to facilitate relative displacement between transverse spar 1 and outer longitudinal spar 5 in the direction stipulated by the elongated hole 12, a flat washer 14 made of molybdenum is arranged beneath the head of screw 13 and an insert 15 made of molybdenum is arranged between transverse spar 1 and outer longitudinal spar 5, so that friction between the joining partners is reduced. The holding elements 2 have continuous grooves 21 on their ends, which are actively connected to a mounting strip 3, in order to be able to displace holding elements 2 simultaneously in the axial direction for loading and unloading of the transport device.

The method of action of the force-free connection between transverse spar 1 and outer longitudinal spar 5 is shown in FIG. 3. The two upper drawings show the condition at normal temperature in a view of the transport device from the support strip 3 (left view) and a section view as in FIG. 2 (right view), i.e., with equal length of all longitudinal spars 5 belonging to the frame. In the same manner, the two lower drawings show the state during operation of the transport device, i.e., during a temperature difference between the inner longitudinal spar 5 and the outer longitudinal spar 5 of about 300 K. As is apparent from comparison of the upper views with the lower views, the end of the drive rail 51 is sealed off with the outside of transverse spar 1 at normal temperature and the screw 13 is situated in an outer position relative to the elongated hole 12. On the other hand, the greater heat expansion of the inner longitudinal spar 5 relative to the outer longitudinal spar 5 in the lower view means that the transverse spar 1 is pushed outward, so that the outside of transverse spar 1 protrudes beyond the end of drive rail 51 by about 3 mm. The screw 13 is now situated in an inner position, referred to elongated hole 12.

FIG. 4 shows, in a perspective view, a configuration of the outer longitudinal spar 5 in the embodiment and in detail views, two different cogged elements of the support column 53. It is apparent from the perspective view that the outer longitudinal spar 5 also includes a support rail 52, having an opening 521 for each holding element 2, in addition to the drive rail 51, not visible in this view, and the support cog 53, already described in the description of FIG. 2. The openings 521 of the support rail 52 then correspond to the indentations 532 of the support cog 53. In the embodiment, the cogged elements 53 are made of ceramic and there are two different types of cogged elements 53, namely a cogged element 53 for the end areas of the longitudinal spar 5 (lower view) and a cogged element 53 for areas of the longitudinal spar 5 lying between the end areas (upper view). As is apparent from the detail views, the cogged elements 53 have openings 531, which serve to insert the cogged elements 53 on pins provided for this purpose on the support rail 52 (covered and therefore not visible in the view), in order to establish their position relative to the support rail 52. Fixation of the cogged elements 53 occurs, as is apparent from the perspective view, by a fixation rail 54 arranged in front of it.

In FIG. 5, the structure of an inner longitudinal spar 5 in a perspective view and the sectional view is shown. The inner longitudinal spar 5 includes a support rail 52, which has an opening 521 for each holding element 2 and a support cog 53 with indentations 532 that correspond to the openings 521 of support rail 52, in which the support cog 53, in similar fashion to the outer longitudinal spar 5, is placed on pins provided for this purpose on support rail 52 (covered and therefore not visible in the drawing) and is fixed to a fixation rail 54 arranged in front of the support cog 53. The support rail 52 of the inner longitudinal spar 5 is an open profile, which faces with the open side the inner area of the frame, in which the tubular substrates are arranged. From this direction, the heat energy emitted by the heat sources present in the vacuum processing system encounters the inner longitudinal spar 5. In the embodiment, the open longitudinal section is roughly J-shaped, i.e., it corresponds roughly to a rectangle, in which one corner and a relatively large part of a long side connected to it were removed and the diagonally opposite corner was rounded off.

The invention claimed is:

1. A vacuum processing installation for coating of tubular substrates, comprising a vacuum connection, a coating source, and a transport device for transport of the tubular substrates in the vacuum processing installation, the transport device comprising a frame structure with retaining elements for fitting the tubular substrates, the frame structure being formed from interconnected longitudinal members extending parallel to a direction of transport of the frame structure and transverse members extending perpendicular to the direction of transport of the frame structure, at least three longitudinal members being provided between two transverse members, and at least one longitudinal member having a different thermal expansion coefficient than other of the longitudinal members, the different thermal expansion coefficient being selected to produce uniform thermal expansion of all longitudinal members when the at least one longitudinal member is heated to a different temperature than the other of the longitudinal members during transport through the vacuum processing installation, whereby deformation of the frame structure is avoided.

2. The vacuum processing installation according to claim 1, wherein at least one longitudinal member is connected to at least one transverse member such that a length change of the at least one longitudinal member does not apply a longitudinal force on the at least one transverse member, the frame structure being essentially rectangular, and the transverse members fully extending between inner longitudinal transverse members.

3. The vacuum processing installation according to claim 1, wherein at least one longitudinal member has an open transverse cross-sectional profile with no closed outer wall.

4. The vacuum processing installation according to claim 3, wherein the open transverse cross-sectional profile comprises a J-shaped profile.

5. The vacuum processing installation according to one of claims 1 and 3, wherein the frame structure is essentially rectangular, and the longitudinal members are essentially rectilinear bars.

6. The vacuum processing installation according to one of claims 1 and 3, wherein the frame structure is essentially cylindrical, and the longitudinal members are essentially circular.

7. The vacuum processing installation according to one of claims 1 to 3, wherein the retaining elements engage ends of the tubular substrates.

8. The vacuum processing installation according to claim 7, wherein the retaining elements are mounted in two groups on opposite sides of the frame structure, so that two oppositely arranged retaining elements can be connected to two ends of a tubular substrate.

9. The vacuum processing installation according to claim 8, wherein the retaining elements of at least one of the two groups are driven by a drive device.

10. The vacuum processing installation according to claim 7, wherein the retaining elements are mounted to rotate.

11. The vacuum processing installation according to claim 7, wherein the retaining elements are made from a ceramic material.

12. The vacuum processing installation according to claim 1, wherein at least one longitudinal member is connected to at least one transverse member such that a length change of the at least one longitudinal member does not apply a longitudinal force on the at least one transverse member.

13. The vacuum processing installation of claim 12, wherein at least one longitudinal member has an open transverse cross-sectional profile with no closed outer wall.

14. The vacuum processing installation according to claim 1, wherein at least one longitudinal member has an open transverse cross-sectional profile with no closed outer wall.

* * * * *